(12) United States Patent
Komatsu et al.

(10) Patent No.: US 7,619,678 B2
(45) Date of Patent: Nov. 17, 2009

(54) SOLID STATE IMAGING DEVICE AND METHOD FOR MANUFACTURING THE SAME

(75) Inventors: Tomoko Komatsu, Kyoto (JP); Tomoki Masuda, Osaka (JP); Nobukazu Teranishi, Tokyo (JP)

(73) Assignee: Panasonic Corporation, Osaka (JP)

( * ) Notice: Subject to any disclaimer, the term of this patent is extended or adjusted under 35 U.S.C. 154(b) by 401 days.

(21) Appl. No.: 11/584,560

(22) Filed: Oct. 23, 2006

(65) Prior Publication Data
US 2007/0117349 A1    May 24, 2007

(30) Foreign Application Priority Data
Nov. 18, 2005    (JP) .............................. 2005-334745

(51) Int. Cl.
H04N 5/225    (2006.01)
(52) U.S. Cl. ..................................... 348/340
(58) Field of Classification Search ................ 348/272, 348/274–276, 340; 359/580–582, 586, 587
See application file for complete search history.

(56) References Cited
U.S. PATENT DOCUMENTS

| | | | | |
|---|---|---|---|---|
| 4,547,798 | A * | 10/1985 | Matsumoto et al. | ......... 348/273 |
| 6,583,438 | B1 * | 6/2003 | Uchida | ......................... 257/59 |
| 7,288,361 | B2 * | 10/2007 | Kakino et al. | ............. 430/270.1 |
| 2003/0063204 | A1 * | 4/2003 | Suda | ........................... 348/272 |
| 2003/0173599 | A1 * | 9/2003 | Nakai | .......................... 257/225 |
| 2004/0081911 | A1 * | 4/2004 | Noglik et al. | ............. 430/270.1 |
| 2006/0044449 | A1 * | 3/2006 | Sakoh | ........................ 348/336 |

FOREIGN PATENT DOCUMENTS

| | | |
|---|---|---|
| JP | 04-275459 | 10/1992 |
| JP | 2719238 B2 | 11/1997 |

* cited by examiner

Primary Examiner—Tuan V Ho
Assistant Examiner—Euel K Cowan
(74) Attorney, Agent, or Firm—McDermott Will & Emery LLP

(57) ABSTRACT

A solid state imaging device includes: a solid state imaging element including a light receiving element, a microlens formed above the light receiving element, a first transparent layer formed on the microlens and a second transparent layer formed on or above the microlens and harder than the first transparent layer; a transparent component formed above the second transparent layer; and an adhesive layer for bonding the second transparent layer and the transparent component. The hard second transparent layer prevents the occurrence of scratches during a dicing step.

14 Claims, 6 Drawing Sheets

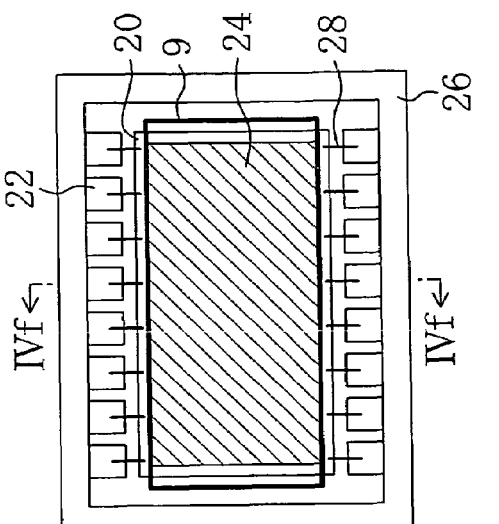
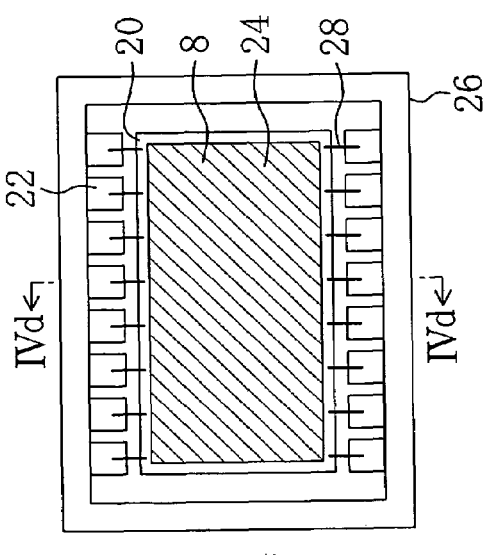
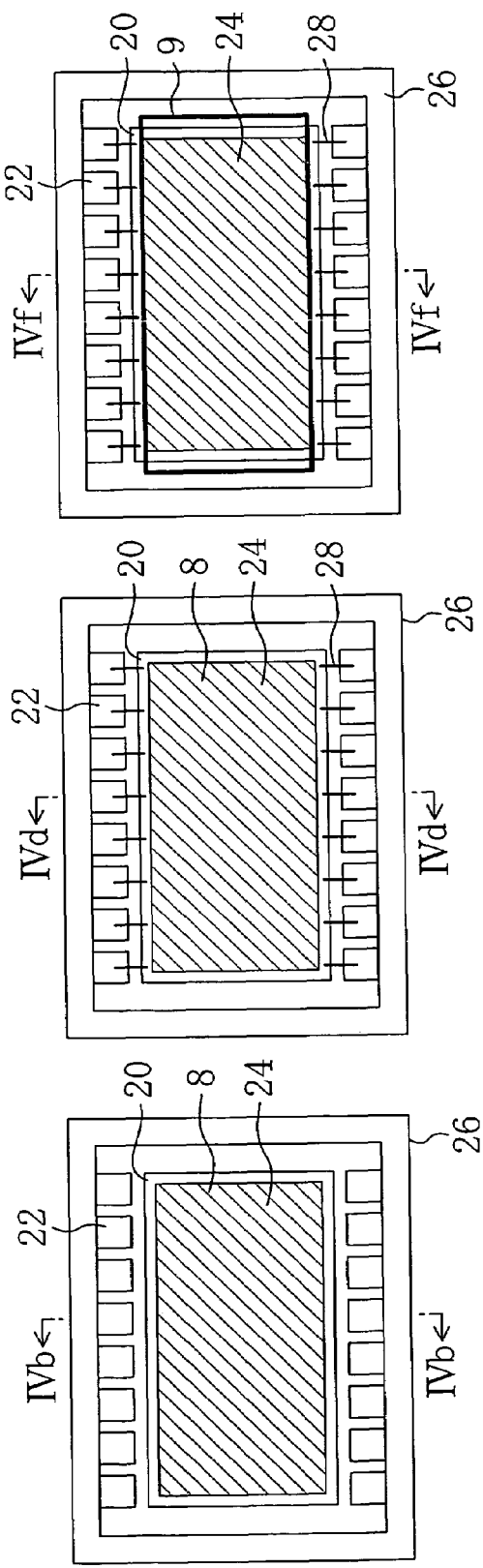
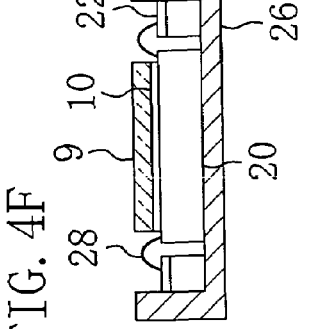
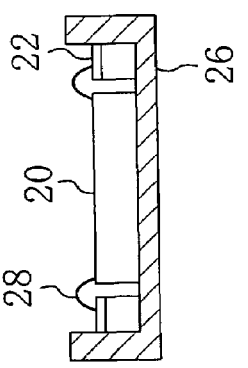
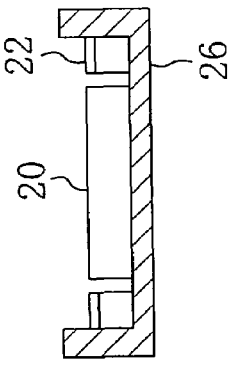

SOLID STATE IMAGING DEVICE AND METHOD FOR MANUFACTURING THE SAME

BACKGROUND OF THE INVENTION

1. Field of the Invention

The present invention relates to a solid state imaging device provided with a transparent component such as glass bonded to a light receiving surface and a method for manufacturing the same.

2. Description of Related Art

A known solid state imaging device using a CCD (charge coupled device) is provided with a solid state imaging element including a photodiode as a light receiving element and a microlens provided above it and a transparent component such as glass for protecting the solid state imaging element.

FIGS. 6A and 6B are sectional views illustrating the structure of a conventional solid state imaging device. In the conventional solid state imaging device, as shown in FIG. 6A, recesses are formed in the top surface of a substrate 101 for forming CCD solid state imaging elements on a subpixel-by-subpixel basis and photodiodes 102 for converting incident light 111 into an electronic signal are provided at the bottom of the recesses, respectively. A first acrylic planarization film 103 is formed on the substrate 101 to make the uneven top surface of the substrate flat. Color filters 104 are formed on the first acrylic planarization film 103 in one-to-one relationship with the photodiodes 102. A second acrylic planarization film 105 is formed on the color filters 104 to bury the unevenness caused by the color filters 104 and the gaps therebetween. Further, microlenses 106 are formed on the second acrylic planarization film 105 in one-to-one relationship with the photodiodes 102.

As shown in FIG. 6B, a solid state imaging element 113 including the photodiodes 102, color filters 104 and microlenses 106 formed on the substrate 101 is placed in a package 112 and the top of the package 112 is covered with a transparent component 109. An air layer (space) 110 exists in the package 112 between the solid state imaging element 113 and the back surface of the transparent component 109 as shown in FIGS. 6A and 6B. Referring to FIG. 6A, the light 111 passes through the transparent component 109 to enter the microlenses 106 and at the same time, reflection occurs on the top and back surfaces of the transparent component 109 and the top surfaces of the microlenses 106. In the conventional solid state imaging device, sufficient sensitivity has been obtained with the light transmitted to the photodiodes 102 only. However, according to finer design rules of the solid state imaging device adopted in recent years, it has been getting more difficult to obtain satisfactory sensitivity only with the light collected by the microlenses. As a solution to this, Japanese Patent No. 2719238 proposes a structure having an anti-reflection film formed on the microlenses.

SUMMARY OF THE INVENTION

The conventional solid state imaging device is disadvantageous in that the degree of reflection at the interface between the air layer 110 and the transparent component is high and dust trapped in the package during transfer may possibly move to an imaging region.

To eliminate the disadvantages, the inventors of the present invention have made a close study of the structure of the device and hit upon an idea of applying a transparent component directly to a transparent resin layer formed to cover the microlenses 106 (see FIG. 6A). With such a structure, the solid state imaging device is not affected by the dust and the like because the air layer 110 is eliminated by the transparent resin layer. If the transparent resin layer is made of a fluorine-containing resin having a lower refractive index than that of the microlenses 106, light transmitted through the microlenses 106 is surely collected on the photodiodes 102. Further, the refractive index of the transparent resin layer can be set to an intermediate value between the refractive index of the transparent component 109 and that of the microlenses 106. Therefore, the difference between the refractive indices of the transparent component 109 and the transparent resin layer is reduced, and so is the difference between the refractive indices of the microlenses 106 and the transparent resin layer. Thus, reflection of light at the interfaces between them is reduced.

However, if the transparent resin layer is made of a fluorine-containing resin having a low refractive index to reduce the reflection of the incident light, a scratch may possibly occur on the top surface of an imaging region of the solid state imaging element in the step of cutting the wafer to separate the solid state imaging elements. The scratch on the top surface of the transparent resin layer causes a black scratch in the resulting image.

In light of the above, the present invention provides a small-sized and high-sensitivity solid state imaging device which is manufactured with high yield and a method for manufacturing the same.

A solid state imaging device according to a first aspect of the present invention includes a solid state imaging element including a light receiving element, a microlens formed above the light receiving element, a first transparent layer formed on the microlens and a second transparent layer formed on or above the microlens and harder than the first transparent layer; a transparent component formed above the second transparent layer; and an adhesive layer for bonding the second transparent layer and the transparent component.

With this structure, the second transparent layer is less likely to be damaged by dust in the dicing step and the solid state imaging device according to the first aspect of the present invention is manufactured with high yield. Further, since there is no air layer between the transparent component and the second transparent layer, the mixing of dust between the transparent component and the microlens is less likely to occur.

In particular, even if the first transparent layer has a lower refractive index than the microlens and is made of a soft fluorine-containing resin, the presence of the second transparent layer reduces the occurrence of damage during the dicing step. As a result, incident light is effectively collected on the light receiving element. Thus, the solid state imaging device according to the first aspect of the present invention is provided with high sensitivity and small size and manufactured with high yield.

Examples of material for the second transparent layer include an acrylic resin, a styrene resin, an epoxy resin and PVA (polyvinyl alcohol) which are free from fluorine. If the second transparent layer is made of material more hydrophilic than the first transparent layer, the dust generated during the dicing step is easily removed, thereby improving the manufacturing yield to a further extent.

The second transparent layer may have a refractive index of about 1.3 or more and 1.6 or less such that the refractive index of the second transparent layer comes between the refractive indices of the first transparent layer and the adhesive layer even when the first transparent layer and the adhesive layer are made of general materials. Accordingly, reflectance at the interfaces between these layers is reduced, thereby making it possible to collect a sufficient amount of light on the light receiving element.

A solid state imaging device according to a second aspect of the present invention includes a solid state imaging element including a light receiving element, a microlens formed above the light receiving element, a first transparent layer formed on the microlens and a second transparent layer formed on or above the microlens and made of material which is more hydrophilic than the first transparent layer; a transparent component formed above the second transparent layer; and an adhesive layer for bonding the second transparent layer and the transparent component.

Since the second transparent layer is more hydrophilic than the first transparent layer, abatement generated during the dicing step is more easily washed away than the case where the second transparent layer is not provided. Therefore, the solid state imaging device according to the second aspect of the present invention is manufactured with high yield.

A method for manufacturing the solid state imaging device according to the first aspect of the present invention includes the steps of: (a) preparing a substrate in the form of a wafer having a light receiving element for converting incident light into an electronic signal and a microlens provided above the light receiving element to collect incident light on the light receiving element; (b) forming a first transparent layer to cover at least the top surface of the microlens; (c) forming a second transparent layer harder than the first transparent layer on the first transparent layer; and (d) cutting the wafer-shaped substrate into chips with the top surface of the second transparent layer exposed.

As the second transparent layer is harder than the first transparent layer, scratches caused by the abatement are less likely to occur as compared with the case where the second transparent layer is not formed in the step (d).

A method for manufacturing the solid state imaging device according to the second aspect of the present invention includes the steps of: (a) preparing a substrate in the form of a wafer having a light receiving element for converting incident light into an electronic signal and a microlens provided above the light receiving element to collect incident light on the light receiving element; (b) forming a first transparent layer to cover at least the top surface of the microlens; (c) forming a second transparent layer made of material which is more hydrophilic than the first transparent layer on the first transparent layer; and (d) cutting the wafer-shaped substrate into chips with the top surface of the second transparent layer exposed and water supplied.

According to the method, the step (d) (dicing) is carried out with the highly hydrophilic second transparent layer exposed. Therefore, the dust generated by cutting the substrate is easily washed away from the substrate surface.

BRIEF DESCRIPTION OF THE DRAWINGS

FIGS. 4A to 4F are plan views and sectional views illustrating the steps of the method for manufacturing the solid state imaging device of the first embodiment after the dicing step.

DETAILED DESCRIPTION OF THE INVENTION

Hereinafter, detailed explanation of embodiments of the present invention is provided with reference to the drawings.

First Embodiment

Structure of Solid State Imaging Device

Figure 1A:
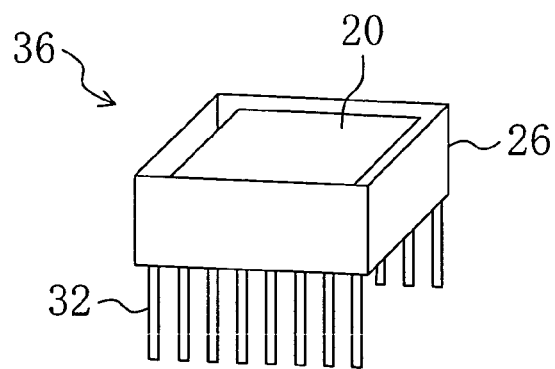
FIG. 1A is an oblique view illustrating the appearance of a solid state imaging device according to a first embodiment of the present invention.
Figure 1B:
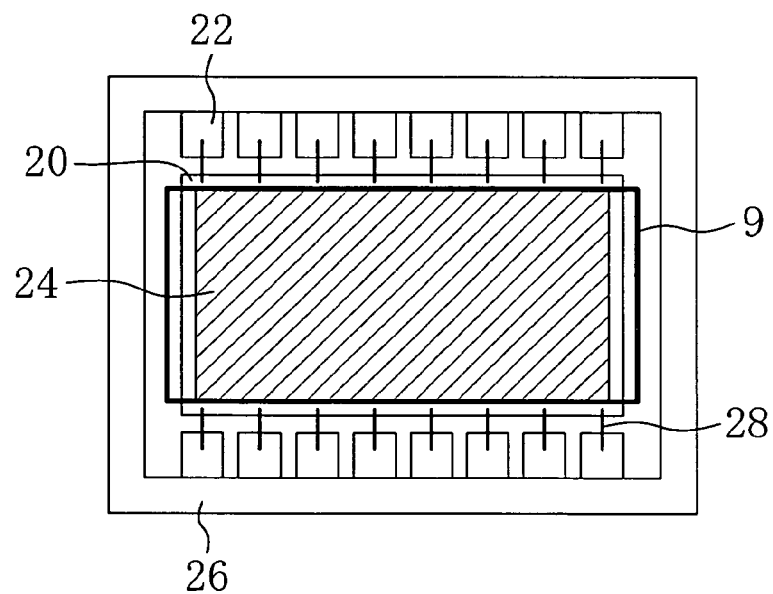
FIG. 1B is a top view of the solid state imaging device and FIG. 1C is a sectional view illustrating part of an imaging region of the solid state imaging device.
Figure 1C:
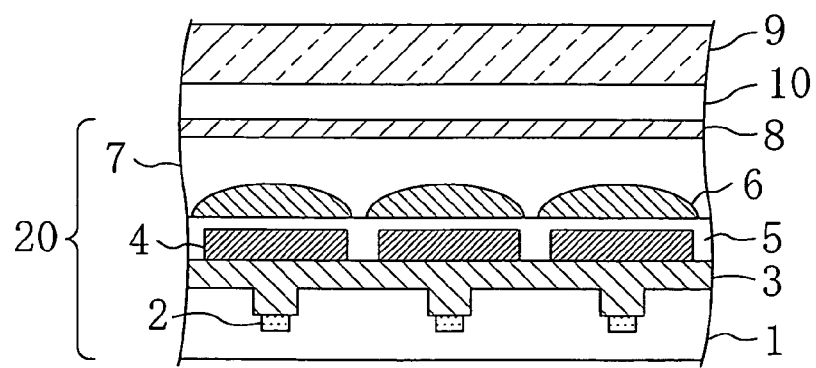

FIG. 1A is an oblique view illustrating the appearance of a solid state imaging device according to a first embodiment of the present invention, FIG. 1B is a top view of the solid state imaging device and FIG. 1C is a sectional view illustrating part of an imaging region of the solid state imaging device.

As shown in FIG. 1A, a solid state imaging device 36 of the present embodiment includes a package 26 carrying a solid state imaging element 20 therein and external terminals 32 for externally transmitting image signals. The solid state imaging element 20 is provided with an imaging region 24 (a shaded portion in FIG. 1B) where light is received.

As shown in FIGS. 1B and 1C, the solid state imaging device 36 of the present embodiment further includes a transparent component 9 made of glass, for example, which is bonded above the solid state imaging element 20 with an adhesive layer 10. The package 26 is provided with terminals 22 electrically connected to the periphery of the imaging region 24 of the solid state imaging element 20 via wires (connectors) 28 and also to the external terminals 32.

The solid state imaging element 20 includes: a substrate 1 for forming CCD solid state imaging elements in which recesses are formed in the imaging region on a subpixel-by-subpixel basis; photodiodes (light receiving elements) 2 disposed at the bottom of the recesses to convert incident light into an electronic signal, respectively; a first planarization film 3 formed on the substrate 1 and the photodiodes 2 to make the top surface of the substrate 1 flat; color filters 4 formed on parts of the first planarization film 3 above the photodiodes 2; a second planarization film 5 formed to cover the color filters 4 to eliminate unevenness caused by the color filters 4; microlenses 6 formed on parts of the second planarization film 5 above the photodiodes 2; a first transparent layer 7 formed on the microlenses 6 to bury at least the microlenses 6; and a second transparent layer 8 formed on the first transparent layer 7 and harder than the first transparent layer 7. A transparent component 9 made of a glass plate is bonded onto the second transparent layer 8 with an adhesive layer 10. In FIG. 1C, the top surface of the first transparent layer 7 is depicted as flat and smooth. However, the top surface of the first transparent layer 7 may be made rough to some extent by oxygen plasma treatment or the like to improve the degree of adhesion between the first and second transparent layer 7 and 8.

Among the above-described components, the first and second planarization films 3 and 5 are transparent and may be made of an acrylic resin. The microlenses 6 are preferably transparent. In the present embodiment, however, the microlenses 6 are made of a positive photosensitive resin having naphthoquinonediazido as a photosensitive group. The transparent component 9 may be made of a transparent resin in place of glass.

The first transparent layer 7 is made of a resin containing fluorine in its molecular structure (i.e., fluorine-containing resin). The second transparent layer 8 may be made of a resin having higher hardness than the fluorine-containing resin. The provision of the second transparent layer 8 harder than the first transparent layer 7 between the first transparent layer 7 and the adhesive layer 10 is a characteristic feature of the solid state imaging device of the present embodiment. The hardnesses of the resins are easily compared using a commercially available hardness meter such as Nanoindenter. Examples of the material for the first transparent layer 7 include a fluorinated acrylic resin and a fluorinated silicone resin. Examples of the material for the second transparent layer 8 include an acrylic resin, a styrene resin, an epoxy resin and PVA (polyvinyl alcohol). The fluorinated resin is suitable as the material for the first transparent layer 7 because it is transparent and relatively soft and has a refractive index lower than that of the microlenses 6. Due to the refractive index lower than that of the microlenses 6, light passing through the microlenses 6 is sufficiently collected on the photodiodes 2. Further, the soft first transparent layer 7 absorbs stress to be applied to the components of the solid state imaging device after the transparent component 9 is adhered, thereby reducing the occurrence of failures. Moreover, as the hardness of the second transparent layer 8 is set higher than that of the first transparent layer 7, scratches are less likely to occur on the top surface of the solid state imaging element during the manufacture.

In the solid state imaging device of the present embodiment, the refractive indices of the microlenses 6, first transparent layer 7, second transparent layer 8, adhesive layer 8 and transparent component 9 are about 1.55 to 2.0, about 1.3 to 1.5, about 1.3 to 1.6, about 1.5 to 1.6 and about 1.55 or higher, respectively.

The components vary in thickness. For example, the thickness of each of the microlenses 6 may be about 0.3 µm or more and 2.0 µm or less. The first transparent layer 7 may have enough thickness to cover at least the top surfaces of the microlenses 6, for example, about 0.1 µm or more and 2.0 µm or less. The thickness of the second transparent layer 8 is about 0.05 µm or more and 2.0 µm or less. The thickness of the adhesive layer 10 may be about 0.05 µm or more and 10 µm or less. Although the first and second transparent layers 7 and 8 are depicted to have flat and smooth top surfaces in FIG. 3F, the first transparent layer 7 may have unevenness on the top surface derived from the configuration of the microlenses 6 and the top surface of the second transparent layer 8 may be flat and smooth.

In the thus-configured solid state imaging device of the present embodiment, light from outside passes through the transparent component 9, adhesive layer 10, second transparent layer 8 and first transparent layer 7 in this order, and then collected on the photodiodes 2 through the microlenses 6. The light is converted into an electronic signal in the photodiodes 2 and sent to the periphery of the substrate 1 via a CCD circuit, and then to the external terminals 32 via the wires 28 and the terminals 22.

Method for Manufacturing Solid State Imaging Device

Hereinafter, explanation of a method for manufacturing the solid state imaging device of the present embodiment is provided.

Figure 2A:
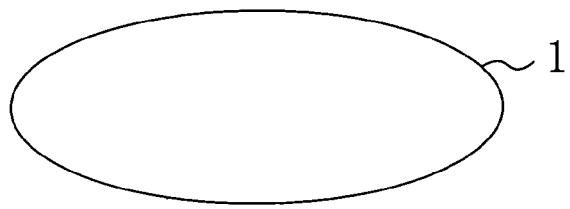
FIGS. 2A to 2D are views illustrating the outline of a method for manufacturing the solid state imaging device of the first embodiment.
Figure 2B:
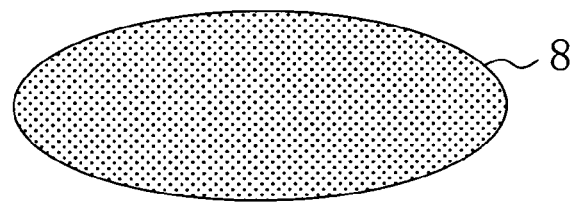
Figure 2C:
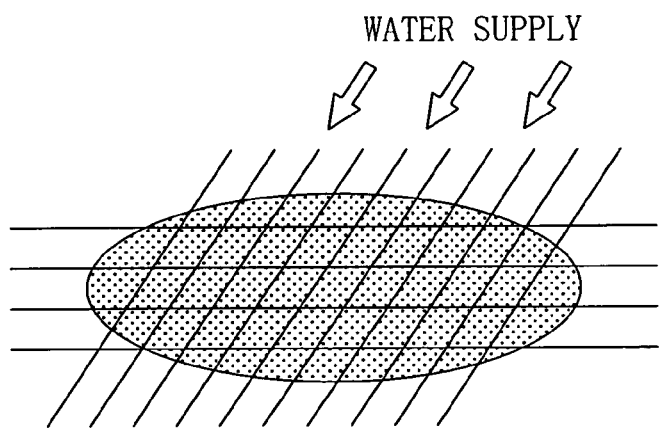

FIGS. 2A to 2D are views illustrating the outline of the method for manufacturing the solid state imaging device of the present embodiment. As shown in FIGS. 2A and 2B, a semiconductor substrate made of silicon in the form of a wafer (hereinafter referred to as a substrate 1 for forming solid state imaging elements) is prepared and solid state imaging elements are formed thereon. Then, as shown in FIG. 2C, the substrate 1 is cut to separate the solid state imaging elements while water and carbon dioxide are supplied. In this stage, the second transparent layer 8 exists at the topmost surface of the substrate 1. Each of the separated solid state imaging elements 20 is disposed in a package (not shown) having a lead frame and assembled into a solid state imaging device as a final product.

Now, detailed explanation of the steps shown in FIGS. 2A to 2D is provided below.

FIGS. 3A to 3G are sectional views illustrating the method for manufacturing the solid state imaging device of the present embodiment and FIGS. 4A to 4F are plan views and sectional views illustrating the steps of the method for manufacturing the solid state imaging device of the present embodiment after the dicing step. FIGS. 3A to 3G show part of an imaging region of the solid state imaging device. FIGS. 4B to 4F are sectional views corresponding to FIGS. 4A to 4E and taken along a line passing through the terminals 22 arranged on both sides of the solid state imaging element 20.

Figure 3A:
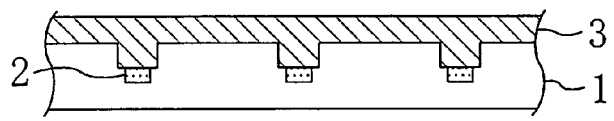
FIGS. 3A to 3G are sectional views illustrating the method for manufacturing the solid state imaging device of the first embodiment.

First, as shown in FIG. 3A, an acrylic resin is applied to the uneven top surface of the substrate 1 where the photodiodes 2 are arranged on a pixel-by-pixel basis while the substrate 1 is rotated. Then, the applied resin is dried by heating at about 180 to 250° C. for about 60 to 600 seconds to form a first planarization film 3.

Figure 3B:
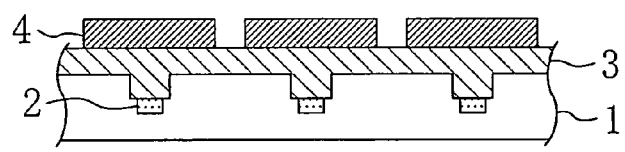

Then, as shown in FIG. 3B, color filters 4 are formed on parts of the first planarization film 3 above the photodiodes 2.

Figure 3C:
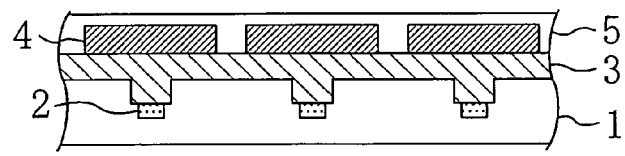

Then, as shown in FIG. 3C, an acrylic resin is applied to the entire surface of the substrate 1 while the substrate 1 is rotated to remove the unevenness cased by the color filters 4. Then, the applied resin is dried by heating at about 180 to 250° C. for about 60 to 600 seconds. In the present embodiment, the application step and the drying step are repeated about 2 to 8 times to obtain a highly smooth second planarization film 5.

Figure 3D:
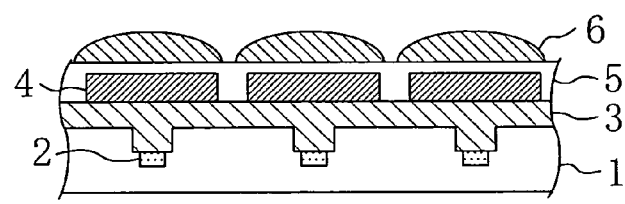

Then, as shown in FIG. 3D, a styrene-based positive photosensitive resist is applied to the entire surface of the second planarization film 5 up to a thickness of 0.5 µm or more while rotating the substrate 1 and dried at a low temperature of about 90 to 110° C. for about 30 to 90 seconds. Then, for example, the applied resist is selectively irradiated with i-rays at exposure energy of 100 to 1000 mJ, followed by development using a TMAH (tetramethyl ammonium hydroxide) solution. Thus, a desired pattern is formed by the remaining resist. Further, the remaining resist and the second planarization film 5 are irradiated with g-rays or other rays having a shorter wavelength than the g-rays at exposure energy of 200 mJ or higher to improve the transmittance of the remaining resist to visible light up to 80% or higher. Then, the remaining resist is heated at a moderate temperature of about 130 to 220° C. for about 60 to 300 seconds. Thus, thermoplastic and thermosetting properties of the remaining resist are both controlled, thereby providing microlenses 6 having a top surface with a desired curvature and a desired refractive index. If the microlenses 6 are heated at a high temperature of about 190 to 280° C. for about 60 to 600 seconds, the microlenses 6 improve in reliability, more specifically, resistance to heat and resistance to solvent (less likely to be deteriorated by the solvent).

Figure 3E:
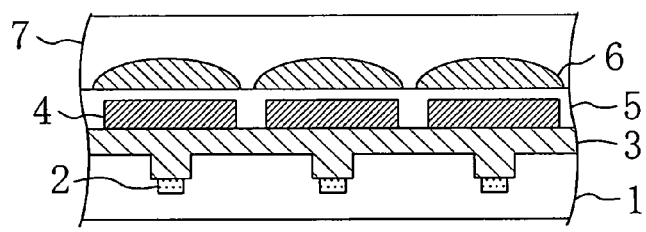

Then, as shown in FIG. 3E, a fluorine-containing resin is applied to the entire surface of the second planarization film 5 on which the microlenses 6 have been formed up to a desired thickness of 0.1 μm or more while rotating the substrate 1. The application of the resin is carried out at about 500 to 5000 rpm (rotation per minute) such that the top surface of the applied resin is not curved along the curved surfaces of the microlenses 6. Then, in order to avoid bumping of a solvent which may cause mixing of air bubbles in the fluorine-containing resin, the resin is dried at a low temperature of about 90 to 120° C. for about 60 to 600 seconds. Then, the fluorine-containing resin is dried by heating at about 150 to 250° C. for about 60 to 600 seconds to cure the resin, thereby forming a first transparent layer 7 having a desired refractive index. If the air bubbles are not likely to be mixed in the resin, the drying step at a low temperature (90 to 120° C.) may be omitted. The fluorine-containing resin may be cured by UV irradiation. In the present embodiment, the first transparent layer 7 may be made of an acrylic resin, an olefin resin or a silicone resin. However, from the viewpoint of heat resistance, a fluorine-containing silicone resin is preferably used. The top surface of the resulting first transparent layer 7 may be subjected to plasma treatment using oxygen-containing gas.

Figure 3F:
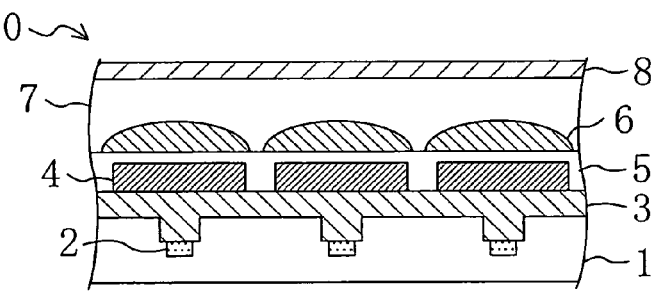
Figure 3G:
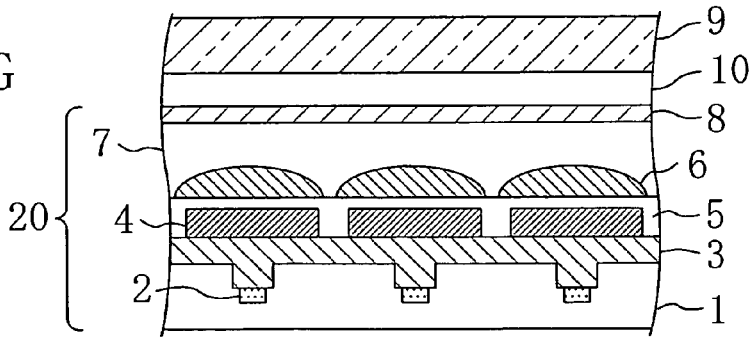

Then, as shown in FIG. 3F, a resin material harder than the first transparent layer 7 is applied to the top surface of the first transparent layer 7 up to a desired thickness of 0.05 μm or more to 1.0 μm or less while rotating the substrate 1. The resin harder than the first transparent layer 7 may be an acrylic resin, a styrene resin, an epoxy resin or PVA. During the resin application, the substrate 1 may be rotated at 500 to 5000 rpm, for example. Then, the resin is dried by heating at about 150 to 250° C. for about 60 to 600 seconds, thereby curing the resin to form a second transparent layer 8. FIG. 3F corresponds to FIG. 2B.

Then, as shown in FIG. 2C, the substrate 1 is cut into chips using a dicing saw while water is supplied onto the top surface thereof, thereby separating the solid state imaging elements 20 (dicing step). In this step, since the hard second transparent layer 8 is exposed at the topmost surface of the solid state imaging elements, damage to the top surfaces of the elements derived from abatement (dust) is reduced as compared with the case where the first transparent layer 7 is exposed at the top. Therefore, the solid state imaging device of the present embodiment is manufactured with higher yield than the solid state imaging device not including the second transparent layer 8.

Then, as shown in FIGS. 4A and 4B, each of the separated solid state imaging elements 20 is disposed in a package 26 having terminals 22. For example, in FIG. 4A, groups of terminals 22 are provided along the long sides of the solid state imaging element 20, respectively. The second transparent layer 8 is provided to cover the whole surface of the substrate 1 including an imaging region 24.

As shown in FIGS. 4C and 4D, wires 28 are formed to connect pads (not shown) formed on the periphery of the imaging region 24 of the substrate 1 and the terminals 22. The wires 28 are preferably formed prior to the bonding of the transparent component 9 because the formation of the wires 28 becomes technically difficult after the transparent component 9 is bonded to cover the top surface of the substrate 1.

Then, as shown in FIGS. 4E and 4F, an adhesive layer 10 made of an adhesive such as an epoxy adhesive or an acrylic adhesive is applied to the top surface of the second transparent layer 8 up to a thickness of 0.05 μm or more and 10 μm or less. A transparent component 9, e.g., a glass plate, is then placed on the adhesive layer 10 and the adhesive layer 10 is cured by heating at 100 to 150° C. to bond the transparent component 9 to the second transparent layer 8. The adhesive layer 10 may be made of a resin which is cured by both of heating and UV irradiation. FIGS. 4E and 4F correspond to FIG. 3G.

Figure 2D:
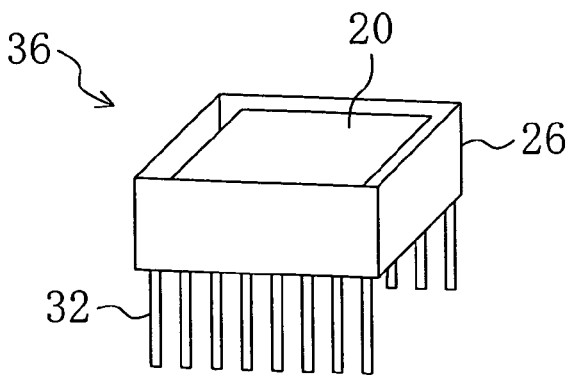

Then, as shown in FIG. 2D, after the formation of the wires 28 and the bonding of the transparent component 9 made of glass, external terminals 32 are formed. Thus, the solid state imaging device of the present embodiment is obtained.

Effect of the Solid State Imaging Device of the Present Embodiment

As described above, according to the method for manufacturing the solid state imaging device of the present embodiment, the dicing is carried out in the step shown in FIG. 2C with the second transparent layer 8 harder than the first transparent layer 7 exposed. Therefore, scratches caused by abatement of the substrate 1 are less likely to occur. In the solid state imaging device of the present embodiment, defects such as black scratches in the resulting image are prevented from occurring. Further, since a relatively soft resin such as a fluorine-containing resin is used as the first transparent layer 7 on the microlenses 6, stress to be applied to the components of the solid state imaging device is absorbed.

The second transparent layer 8 has a refractive index of about 1.3 or more and 1.6 or less in the present embodiment. If the refractive index of the first transparent layer 7 is set about 1.4 which is lower than that of the microlenses 6, the difference in refractive index between the first and second transparent layer 7 and 8 is reduced, and so is the difference in refractive index between the second transparent layer 8 and the adhesive layer 10. This prevents the reflection of the incident light at the interface between the first and second transparent layers 7 and 8 and the interface between the second transparent layer 8 and the adhesive layer 10. Therefore, a sufficient amount of light is collected even if the light receiving element is reduced in size, thereby providing the solid state imaging device with high sensitivity.

Figure 6A:
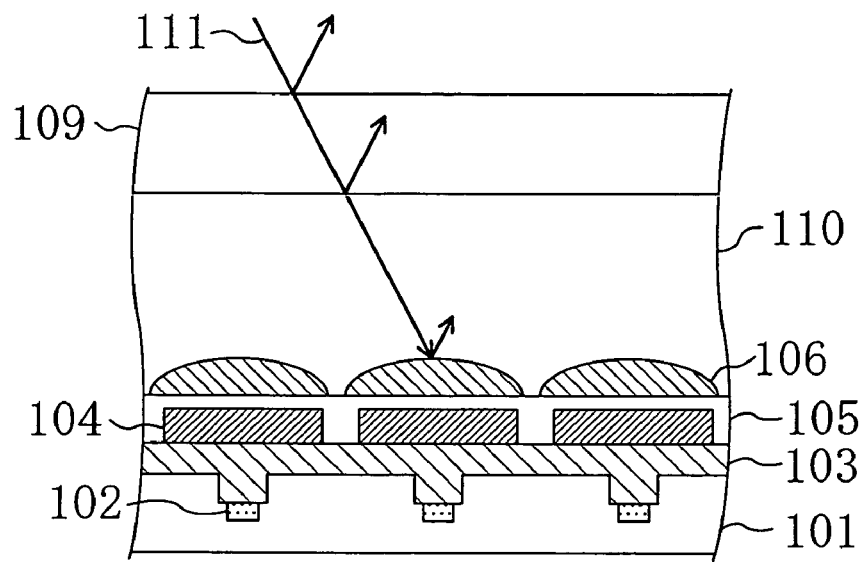
FIGS. 6A and 6B are sectional views illustrating the structure of a conventional solid state imaging device.
Figure 6B:
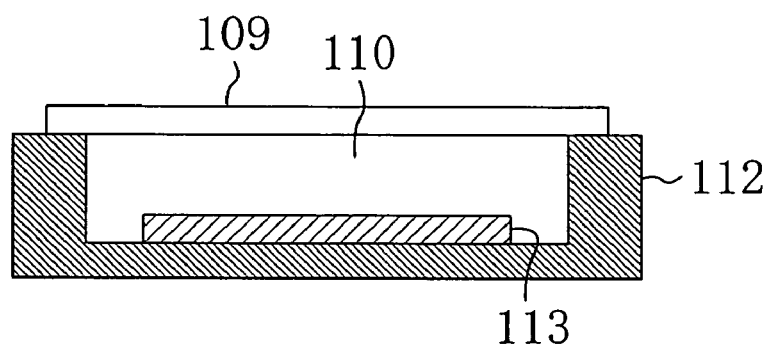

Further, since the transparent component 9 is directly bonded onto the solid state imaging element 20 with the adhesive layer 10 interposed therebetween, the mixing of dust in the package is prevented. Moreover, the total thickness of the device is reduced as compared with the conventional solid state imaging device shown in FIG. 6B.

Thus, the solid state imaging device of the present embodiment, which is highly sensitive and small-sized, is manufactured with high yield.

Second Embodiment

Figure 5A:
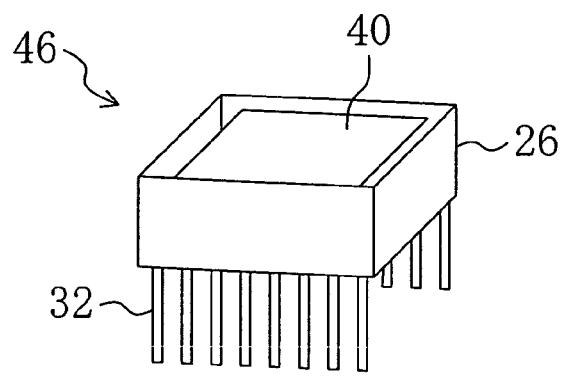
FIG. 5A is an oblique view illustrating the appearance of a solid state imaging device according to a second embodiment of the present invention.
Figure 5B:
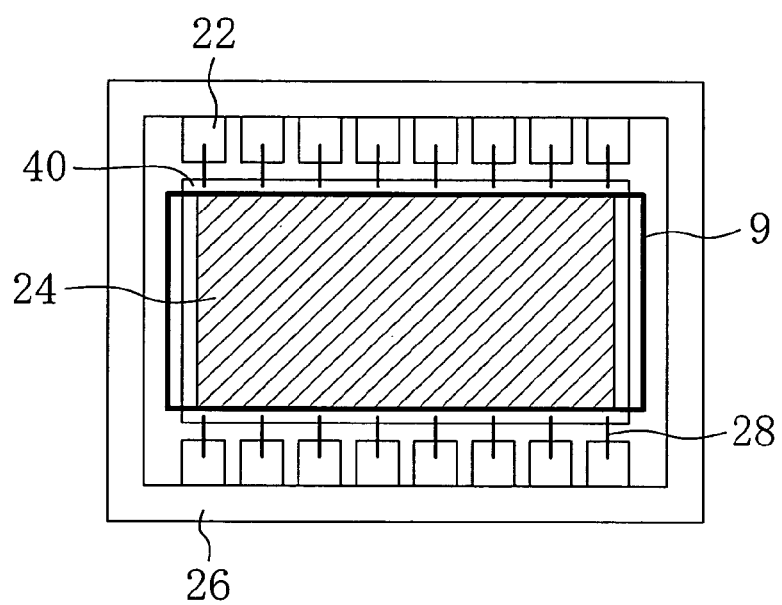
FIG. 5B is a top view of the solid state imaging device and FIG. 5C is a sectional view illustrating part of an imaging region of the solid state imaging device.
Figure 5C:
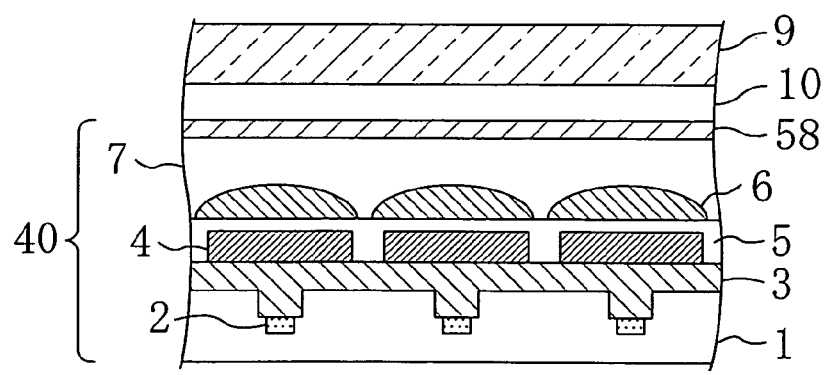

FIG. 5A is an oblique view illustrating the appearance of a solid state imaging device of a second embodiment of the present embodiment, FIG. 5B is a top view of the solid state imaging device and FIG. 5C is a sectional view illustrating part of an imaging region of the solid state imaging device. In FIGS. 5A to 5C, the same components as those of the first embodiment shown in FIGS. 1A to 1C are indicated by the same reference numerals to omit the explanation.

As shown in FIG. 5A, a solid state imaging device 46 of the present embodiment includes a package 26 carrying a solid state imaging element 40 therein and external terminals 32 for externally transmitting image signals. The solid state imaging element 40 is provided with an imaging region 24 (a shaded portion in FIG. 5B) where light is received.

As shown in FIGS. 5B and 5C, the solid state imaging device 46 of the present embodiment is the same as the solid state imaging device 36 of the first embodiment except that a second transparent layer 58 made of material which is more hydrophilic than the first transparent layer 7 is provided between the first transparent layer 7 and the adhesive layer 10.

The second transparent layer 58 in the solid state imaging device 46 of the present embodiment is about 0.05 μm or more and 2.0 μm or less in thickness and may be made of at least one of an acrylic resin, a styrene resin, an epoxy resin and PVA which do not contain fluorine in their molecular structures.

The solid state imaging device 46 of the present embodiment is manufactured by the same method described in the first embodiment. Since the second transparent layer 58 is highly hydrophilic, water reaches easily between the abatement and the second transparent layer 58 during the dicing step shown in FIG. 2C, thereby easily washing the abatement away. Therefore, the scratches are less likely to occur on the top surface of the second transparent layer 58 and the mixing of the abatement in the package 26 is prevented. Thus, the solid state imaging device of the present embodiment is manufactured with high yield. It is more preferable if the second transparent layer 58 is more hydrophilic and harder than the first transparent layer 7 because the occurrence of the scratches is further prevented.

If the first transparent layer 7 is made of a fluorine-containing material, the top surface of the first transparent layer 7 may be subjected to oxygen plasma treatment to make it hydrophilic to some extent. However, according to the inventors' confirmation, the abatement was not satisfactorily washed away in the absence of the second transparent layer 58, the scratches were formed on the first transparent layer 7 and the abatement remained undesirably on the imaging region 24. However, if the second transparent layer 58 is provided, the occurrence of the scratches is significantly reduced and the abatement is removed well. This indicates that the provision of the highly hydrophilic second transparent layer 58 is significantly effective.

Thus, as described above, the solid state imaging device and the method for manufacturing the same according to the present invention are useful for the manufacture of solid state imaging devices for video cameras and the like.

What is claimed is:

1. A solid state imaging device comprising:
   a solid state imaging element including a light receiving element, a microlens formed above the light receiving element, a first transparent layer formed on the microlens and a second transparent layer formed on or above the microlens and harder than the first transparent layer;
   a transparent component formed above the second transparent layer; and
   an adhesive layer for bonding the second transparent layer and the transparent component,
   wherein the first transparent layer has a refractive index lower than a refractive index of the microlens.

2. The solid state imaging device of claim 1, wherein the first transparent layer is made of a fluorine-containing resin.

3. The solid state imaging device of claim 1, wherein the second transparent layer is made of material which is more hydrophilic than the first transparent layer.

4. The solid state imaging device of claim 1, wherein the second transparent layer has a refractive index of 1.3 or more and 1.6 or less.

5. The solid state imaging device of claim 1, wherein the second transparent layer is made of a resin containing no fluorine in its molecular structure.

6. A solid state imaging device comprising:
   a solid state imaging element including a light receiving element, a microlens formed above the light receiving element, a first transparent layer formed on the microlens and a second transparent layer formed on or above the microlens and made of material which is more hydrophilic than the first transparent layer;
   a transparent component formed above the second transparent layer; and
   an adhesive layer for bonding the second transparent layer and the transparent component,
   wherein the first transparent layer has a refractive index lower than a refractive index of the microlens.

7. The solid state imaging device of claim 1, wherein
   the first transparent layer is made of a fluorine-containing resin and
   the second transparent layer is made of at least one of an acrylic resin, a styrene resin, an epoxy resin and polyvinyl alcohol.

8. A method for manufacturing a solid state imaging device comprising the steps of:
   (a) preparing a substrate in the form of a wafer having a light receiving element for converting incident light into an electronic signal and a microlens provided above the light receiving element to collect incident light on the light receiving element;
   (b) forming a first transparent layer to cover at least the top surface of the microlens, wherein the first transparent layer has a refractive index lower than a refractive index of the microlens;
   (c) forming a second transparent layer harder than the first transparent layer on the first transparent layer; and
   (d) cutting the wafer-shaped substrate into chips with the top surface of the second transparent layer exposed.
   (e) bonding a transparent component onto the second transparent layer with an adhesive.

9. A method for manufacturing a solid state imaging device comprising the steps of:
   (a) preparing a substrate in the form of a wafer having a light receiving element for converting incident light into an electronic signal and a microlens provided above the light receiving element to collect incident light on the light receiving element;
   (b) forming a first transparent layer to cover at least the top surface of the microlens, wherein the first transparent layer has a refractive index lower than a refractive index of the microlens;
   (c) forming a second transparent layer made of material which is more hydrophilic than the first transparent layer on the first transparent layer; and
   (d) cutting the wafer-shaped substrate into chips with the top surface of the second transparent layer exposed and water supplied.
   (e) bonding a transparent component onto the second transparent layer with an adhesive.

10. The solid state imaging device of claim 1, wherein a surface of the first transparent layer is flat.

11. The solid state imaging device of claim 1, wherein the refractive indices of the microlends, the first transparent layer, and the second transparent layer are about 1.55 to 2.0, about 1.3 to 1.5, and about 1.3 to 1.6, respectively.

12. The solid state imaging device of claim 1, wherein the adhesive layer is made of a thermosetting resin or an UV curable resin.

13. The solid state imaging device of claim 1, wherein a transparent component is made of glass.

14. The method of claim 9, wherein the step (d), abatement is washed away.

* * * * *

UNITED STATES PATENT AND TRADEMARK OFFICE
CERTIFICATE OF CORRECTION

PATENT NO. : 7,619,678 B2
APPLICATION NO. : 11/584560
DATED : November 17, 2009
INVENTOR(S) : Komatsu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 426 days.

Signed and Sealed this

Twenty-sixth Day of October, 2010

David J. Kappos
*Director of the United States Patent and Trademark Office*